(12) United States Patent
Hatazaki et al.

(10) Patent No.: US 10,825,770 B2
(45) Date of Patent: Nov. 3, 2020

(54) SEMICONDUCTOR DEVICE HAVING A STACK BODY INCLUDING METAL FILMS AND FIRST INSULATING FILMS ALTERNATELY STACKED ON A SEMICONDUCTOR SUBSTRATE AND INCLUDING A STEPPED END PORTION AND MANUFACTURING METHOD THEREOF

(71) Applicant: TOSHIBA MEMORY CORPORATION, Minato-ku (JP)

(72) Inventors: Akitsugu Hatazaki, Yokkaichi (JP); Hiroko Tahara, Yokkaichi (JP); Naomi Fukumaki, Yokkaichi (JP); Masayuki Kitamura, Yokkaichi (JP); Takashi Ohashi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/298,056

(22) Filed: Mar. 11, 2019

(65) Prior Publication Data

US 2020/0091081 A1    Mar. 19, 2020

(30) Foreign Application Priority Data

Sep. 18, 2018  (JP) ................................. 2018-173563

(51) Int. Cl.
*H01L 21/768*  (2006.01)
*H01L 27/11551*  (2017.01)
(Continued)

(52) U.S. Cl.
CPC .. *H01L 23/53266* (2013.01); *H01L 21/76804* (2013.01); *H01L 21/76847* (2013.01);
(Continued)

(58) Field of Classification Search
CPC ......... H01L 27/11551; H01L 27/11578; H01L 27/11521; H01L 21/8221; H01L 21/76843
See application file for complete search history.

(56) References Cited

U.S. PATENT DOCUMENTS 6,022,810 A    2/2000  Kusumi et al.
8,541,830 B1   9/2013  Nagashima et al.
(Continued)

FOREIGN PATENT DOCUMENTS

JP    9-45763    2/1997
JP    11-145281  5/1999
(Continued)

OTHER PUBLICATIONS

Itoh, H., et al. "Low pressure chemical vapor deposition of tungsten", OYOBUTURI vol. 61, Issue 11, 1992, 2 pages (with English Translation).

*Primary Examiner* — Phat X Cao
(74) *Attorney, Agent, or Firm* — Oblon, McClelland, Maier & Neustadt, L.L.P.

(57) ABSTRACT

A semiconductor device according to one embodiment includes a semiconductor substrate, a stack body including metal films and first insulating films alternately stacked on the semiconductor substrate and including a stepped end portion, conducting films respectively protruding from the metal films on all steps of the end portion, contact portions respectively provided above the conducting films, a second insulating film surrounding side surfaces of the contact portions, and a barrier metal film provided between the second insulating film and the contact portions and between the conducting films and the contact portions. The entire top surfaces of the conducting films are covered by the barrier metal film and the second insulating film.

6 Claims, 8 Drawing Sheets

(51) Int. Cl.
  *H01L 27/11521* (2017.01)
  *H01L 21/822* (2006.01)
  *H01L 27/11578* (2017.01)
  *H01L 23/532* (2006.01)
  *H01L 21/311* (2006.01)

(52) U.S. Cl.
  CPC .... *H01L 21/76877* (2013.01); *H01L 21/8221* (2013.01); *H01L 27/11521* (2013.01); *H01L 27/11551* (2013.01); *H01L 27/11578* (2013.01); *H01L 21/31116* (2013.01); *H01L 21/7684* (2013.01)

(56) References Cited

U.S. PATENT DOCUMENTS

| | | | |
|---|---|---|---|
| 8,637,864 B2 | 1/2014 | Saito et al. | |
| 8,728,889 B2* | 5/2014 | Lee | H01L 21/76802 |
| | | | 438/257 |
| 8,860,119 B2 | 10/2014 | Kim et al. | |
| 9,082,663 B2 | 7/2015 | Isobe et al. | |
| 2010/0320526 A1* | 12/2010 | Kidoh | H01L 23/522 |
| | | | 257/324 |
| 2015/0303211 A1 | 10/2015 | Lee et al. | |
| 2016/0343825 A1* | 11/2016 | Bae | H01L 29/665 |
| 2017/0084532 A1 | 3/2017 | Son et al. | |

FOREIGN PATENT DOCUMENTS

| | | |
|---|---|---|
| JP | 2011-60958 | 3/2011 |
| JP | 2013-69932 | 4/2013 |
| JP | 2013-77815 | 4/2013 |
| JP | 2018-117157 | 7/2018 |

\* cited by examiner

SEMICONDUCTOR DEVICE HAVING A STACK BODY INCLUDING METAL FILMS AND FIRST INSULATING FILMS ALTERNATELY STACKED ON A SEMICONDUCTOR SUBSTRATE AND INCLUDING A STEPPED END PORTION AND MANUFACTURING METHOD THEREOF

CROSS-REFERENCE TO RELATED APPLICATIONS

This application is based upon and claims the benefit of priority from Japanese Patent Application No. 2018-173563, filed on Sep. 18, 2018; the entire contents of which are incorporated herein by reference.

FIELD

The embodiments of the present invention relate to a semiconductor device and a manufacturing method thereof.

BACKGROUND

A three-dimensional semiconductor memory being an example of a semiconductor device includes a stack body in which metal films functioning as word lines and insulating films are alternately stacked. An end portion of the stack body is processed in a stepwise manner. The metal films are connected to contact portions on respective steps of the end portion.

In the semiconductor memory as described above, contact portions with different depths need to be formed with increase in the number of stacked films. At this time, when deep contact portions and shallow contact portions are to be formed simultaneously, the metal films are likely to be damaged and pierced through during processing of the contact portions if the metal films do not have a sufficient selectivity with respect to the contact processing. Further, if the width (terrace length) of the respective steps at the end portion is short, it is difficult to ensure a dielectric breakdown voltage between the metal films.

DETAILED DESCRIPTION

Embodiments will now be explained with reference to the accompanying drawings. The present invention is not limited to the embodiments.

A semiconductor device according to an embodiment comprises a semiconductor substrate, a stack body including metal films and first insulating films alternately stacked on the semiconductor substrate and including a stepped end portion, conducting films respectively protruding from the metal films on all steps of the end portion, contact portions respectively provided above the conducting films, a second insulating film surrounding side surfaces of the contact portions, and a barrier metal film provided between the second insulating film and the contact portions and between the conducting films and the contact portions. The entire top surfaces of the conducting films are covered by the barrier metal film and the second insulating film.

Figure 1:
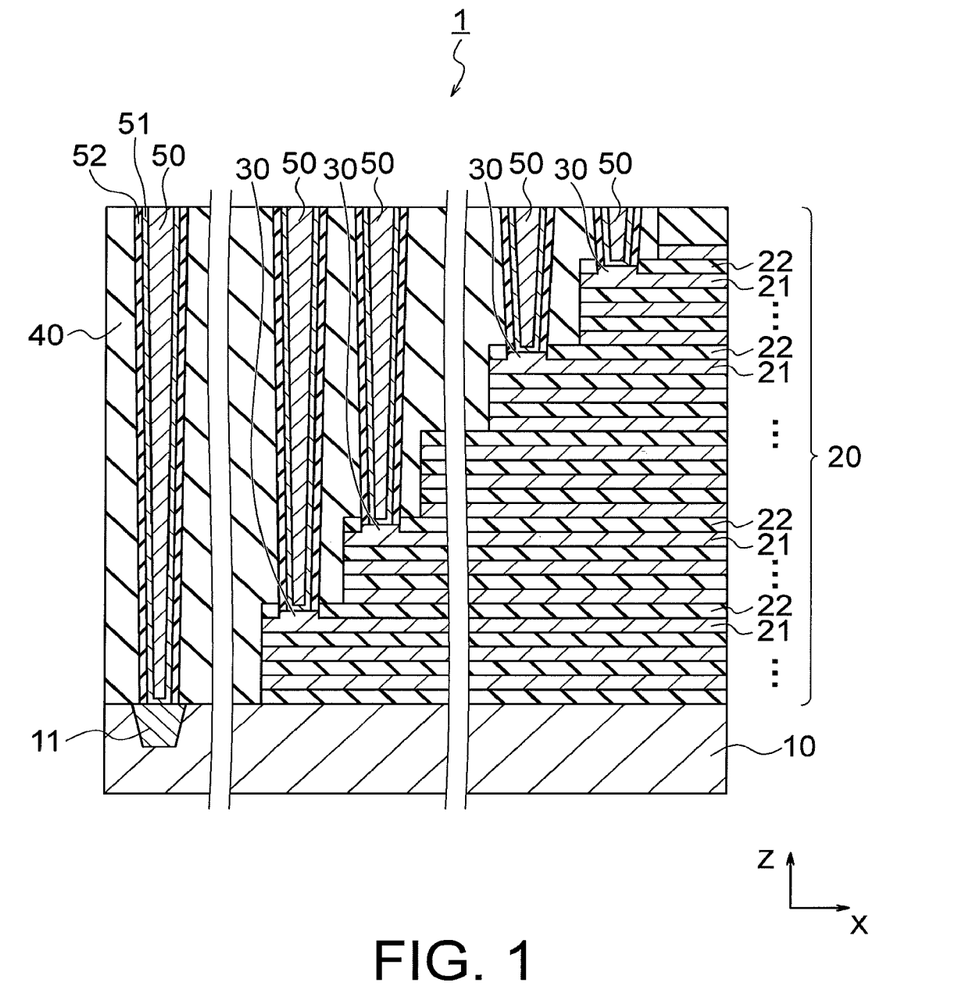
FIG. 1 is a sectional view illustrating a structure of an end portion of a semiconductor device according to one embodiment.

FIG. 1 is a sectional view illustrating a structure of an end portion of a semiconductor device according to one embodiment. A semiconductor device 1 illustrated in FIG. 1 is a three-dimensional semiconductor storage device in which word lines are stacked. Specifically, the semiconductor device 1 includes a semiconductor substrate 10, a stack body 20, conducting films 30, an interlayer film 40, contact portions 50, barrier metal films 51, and insulating films 52.

The semiconductor substrate 10 is a silicon substrate, for example. A wiring layer 11 is provided in the semiconductor substrate 10. The stack body 20 is provided on the semiconductor substrate 10.

While the stack body 20 is provided directly on the semiconductor substrate 10 in the present embodiment, a foundation layer including elements and wires required for driving of memory cells (not illustrated) may be, for example, formed between the semiconductor substrate 10 and the stack body 20.

Metal films 21 and insulating films 22 are alternately stacked in a Z direction orthogonal to the semiconductor substrate 10 in the stack body 20. The metal films 21 include metal including at least one of tungsten (W), cobalt (Co), nickel (Ni), and molybdenum (Mo) and function as word lines. The insulating films 22 are formed as silicon dioxide films ($SiO_2$), for example. The insulating films 22 are an example of first insulating films. An end portion of the stack body 20 is processed in a stepwise manner as illustrated in FIG. 1.

The conducting films 30 are provided on respective steps of end portions of the metal films 21. The material included in the conducting films 30 is the same as that of the material included in the metal films 21. The conducting films 30 can enlarge processing margins of the contact portions 50 in the Z direction. In order to provide a sufficient dielectric breakdown voltage between the metal films 21, it is desirable that the thickness of the conducting films 30 is equal to or smaller than a half of the thickness of the insulating films 22.

The interlayer film 40 entirely covers the stack body 20. The interlayer film 40 is formed as a silicon dioxide film, for example.

The contact portions 50 penetrate the interlayer film 40 to be electrically connected to the conducting films 30 on the respective steps. At the end portion of the stack body 20, risers (not illustrated) are also formed in a Y direction orthogonal to the X direction and the Z direction in FIG. 1 as well as risers in the X direction illustrated in FIG. 1. Metal films 21 on topmost layers of the respective steps are connected to the contact portions 50 via the conducting films 30 with the risers in the X direction as illustrated in FIG. 1. Meanwhile, other metal films 21 of the respective steps are connected to the contact portions 50 via the conducting films 30 with the risers (not illustrated) in the Y direction. In this way, the contact portions 50 are connected to the metal films 21 on all layers.

The barrier metal film 51 is formed between the contact portion 50 and the insulating film 52. The barrier metal film 51 is formed as a titanium nitride film (TiN), for example. The insulating film 52 and the barrier metal film 51 are in direct contact with the entire top surfaces of the conducting films 30. The contact portions 50 are electrically connected to the corresponding conducting films 30 via the barrier metal film 51.

The insulating film 52 surrounds the side surfaces of the contact portions 50 with the barrier metal film 51 interposed therebetween. The insulating film 52 is an example of a second insulating film. The insulating film 52 is formed as a silicon dioxide film, for example. With the insulating film 52, the dielectric breakdown voltage between the metal films 21, that is, the dielectric breakdown voltage between the word lines can be sufficiently provided.

A manufacturing method of the semiconductor device 1 according to the present embodiment described above is explained below with reference to FIGS. 2 to 8.

Figure 2:
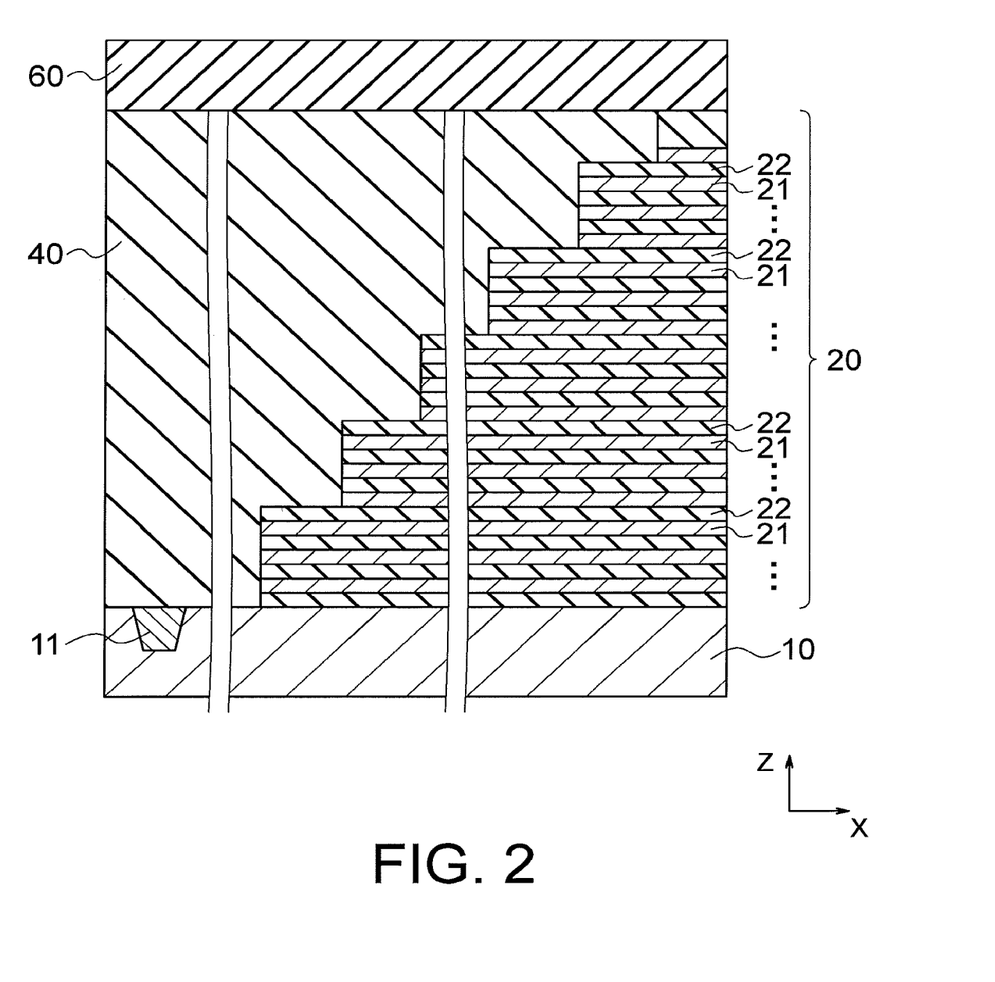
FIG. 2 is a sectional view for explaining a process of forming a mask.

First, as illustrated in FIG. 2, a stack body 20 including the metal films 21 and the insulating films 22 stacked alternately and including a stepped end portion is formed and a mask 60 is formed on the stack body 20. The mask 60 is a carbon mask or an amorphous silicon mask, for example.

Figure 3:
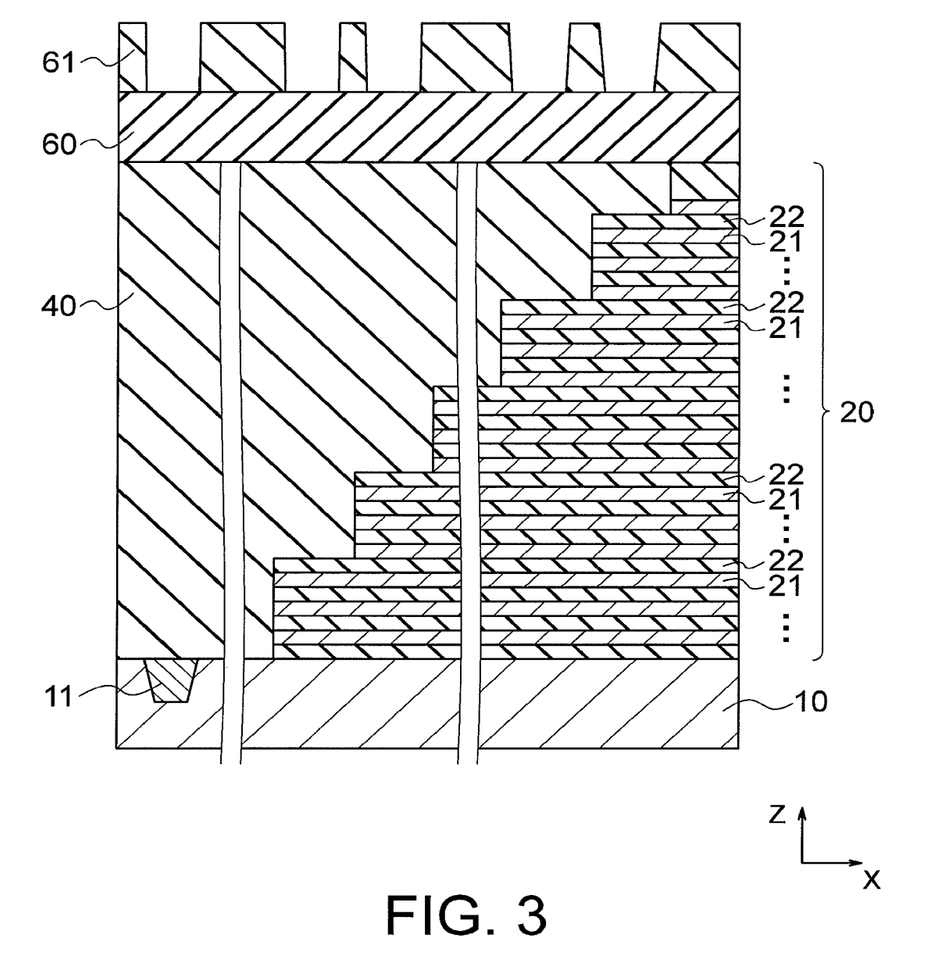
FIG. 3 is a sectional view for explaining a process of forming a resist.

Next, a resist 61 is formed on the mask 60 as illustrated in FIG. 3. A concave and convex pattern is formed on the resist 61. Concave portions in the concave and convex pattern correspond to the steps of the end portion of the stack body 20, respectively.

Figure 4A:
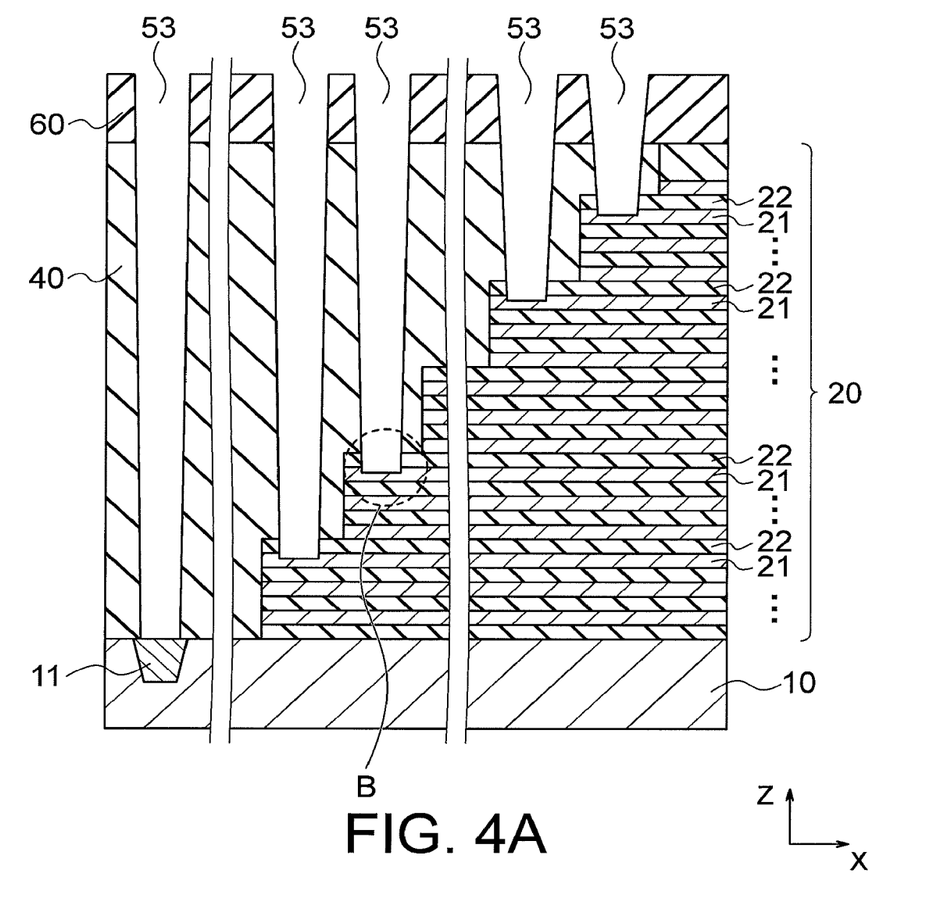
FIG. 4A is a sectional view for explaining a process of forming contact holes.

Next, the interlayer film 40 is etched using the mask 60 and the resist 61. As a result, a plurality of contact holes 53 having different depths are formed simultaneously on the stepped end portion of the stack body 20 as illustrated in FIG. 4A. Each of the contact holes 53 reaches the metal film 21 on the corresponding step or the wiring layer 11 of the semiconductor substrate 10.

Figure 4B:
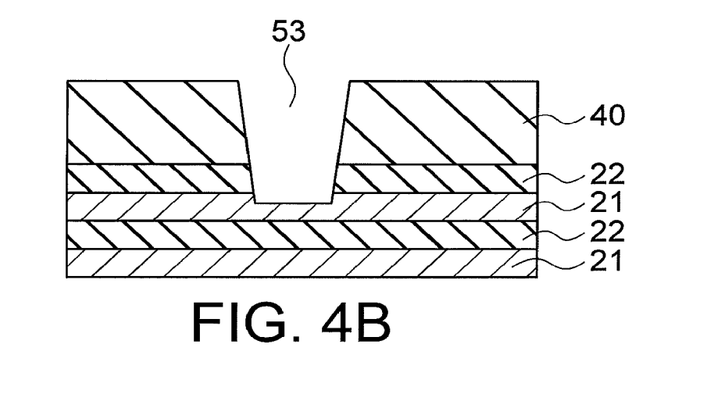
FIG. 4B is an enlarged view of a region B illustrated in FIG. 4A.

In a contact-hole formation process illustrated in FIG. 4A, the contact holes 53 are formed by RIE (Reactive Ion Etching). At this time, parts of the metal films 21 may be etched as illustrated in FIG. 4B. FIG. 4B is an enlarged view of a region B illustrated in FIG. 4A.

Figure 5A:
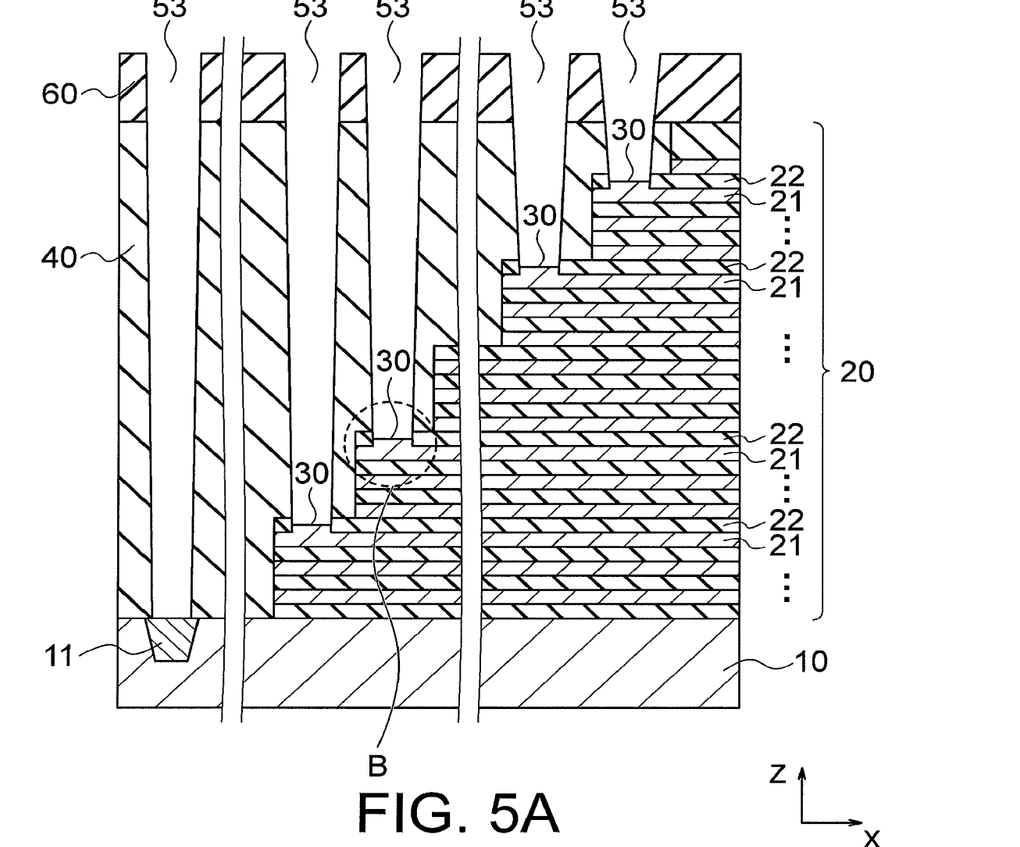
FIG. 5A is a sectional view for explaining a process of forming a conducting films.
Figure 5B:
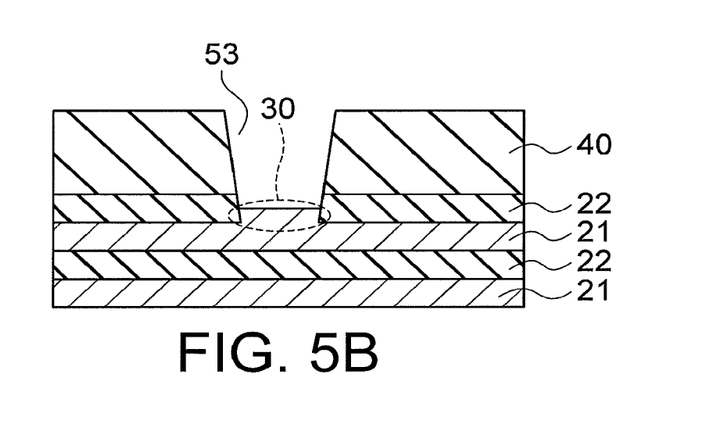
FIG. 5B is an enlarged view of a region B illustrated in FIG. 5A.

Next, the conducting films 30 are formed on the metal films 21 exposed from the contact holes 53, respectively, as illustrated in FIGS. 5A and 5B. FIG. 5B is an enlarged view of a region B illustrated in FIG. 5A. The conducting films 30 can be formed using a CVD (Chemical Vapor Deposition) method, for example. At this time, in order to provide a sufficient dielectric breakdown voltage between the metal films 21, it is desirable that the conducting films 30 are formed to have a thickness equal to or smaller than a half of the thickness of the insulating films 22.

When the metal films 21 are tungsten films if, for example, tungsten hexafluoride ($WF_6$) gas and hydrogen gas ($H_2$) are used as material gas and reducing gas, respectively, the conducting films 30 including tungsten can be formed integrally with the metal films 21. After formation of the conducting films 30, the mask 60 is removed. However, the mask 60 may be removed before formation of the conducting films 30.

Figure 6A:
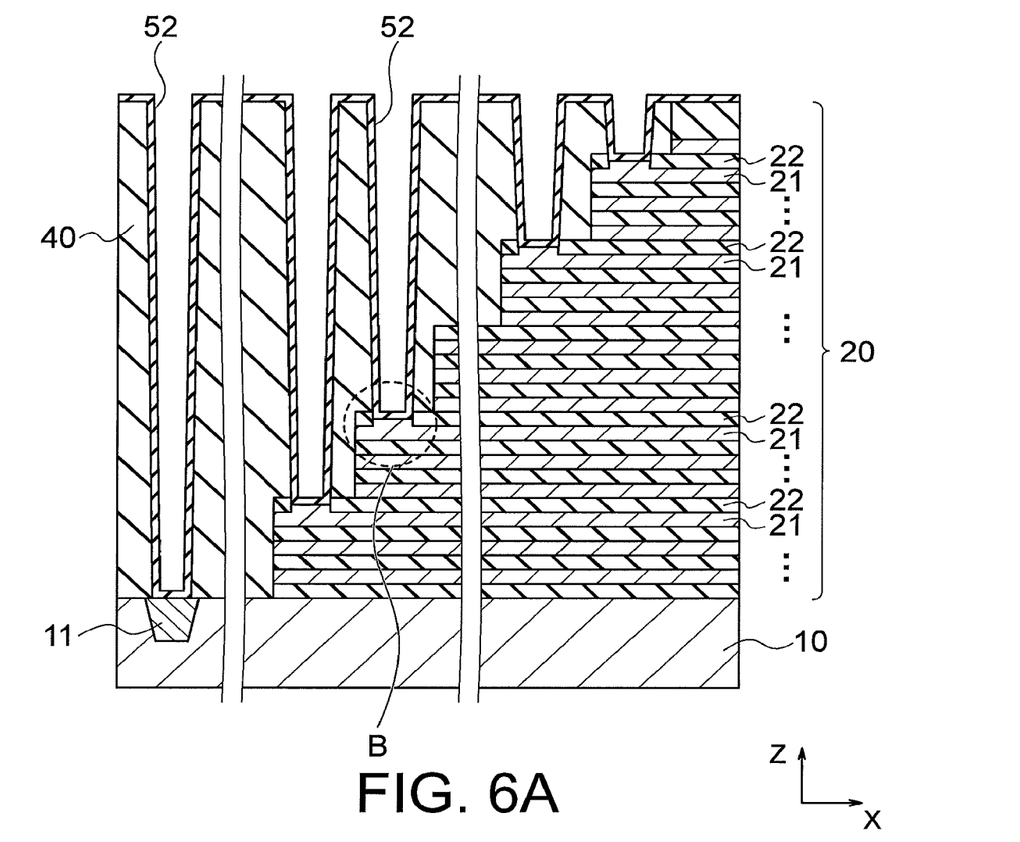
FIG. 6A is a sectional view for explaining a process of forming an insulating body in contact holes.
Figure 6B:
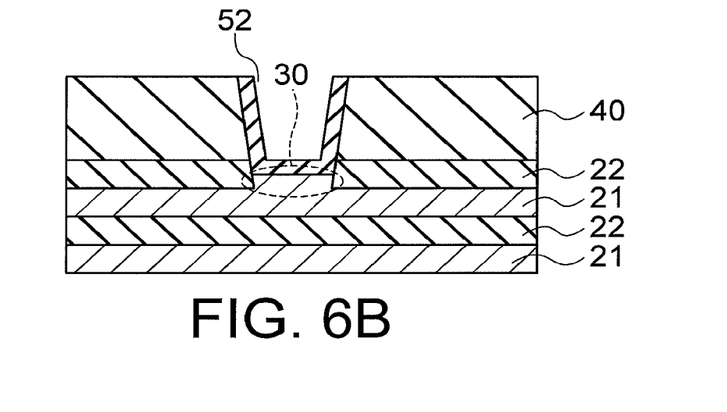
FIG. 6B is an enlarged view of a region B illustrated in FIG. 6A.

Next, as illustrated in FIGS. 6A and 6B, the insulating film 52 is formed on the inner surfaces of the contact holes 53 and the top surface of the interlayer film 40. FIG. 6B is an enlarged view of a region B illustrated in FIG. 6A. The insulating film 52 can be formed using an ALD (Atomic Layer Deposition) method, for example.

Figure 7A:
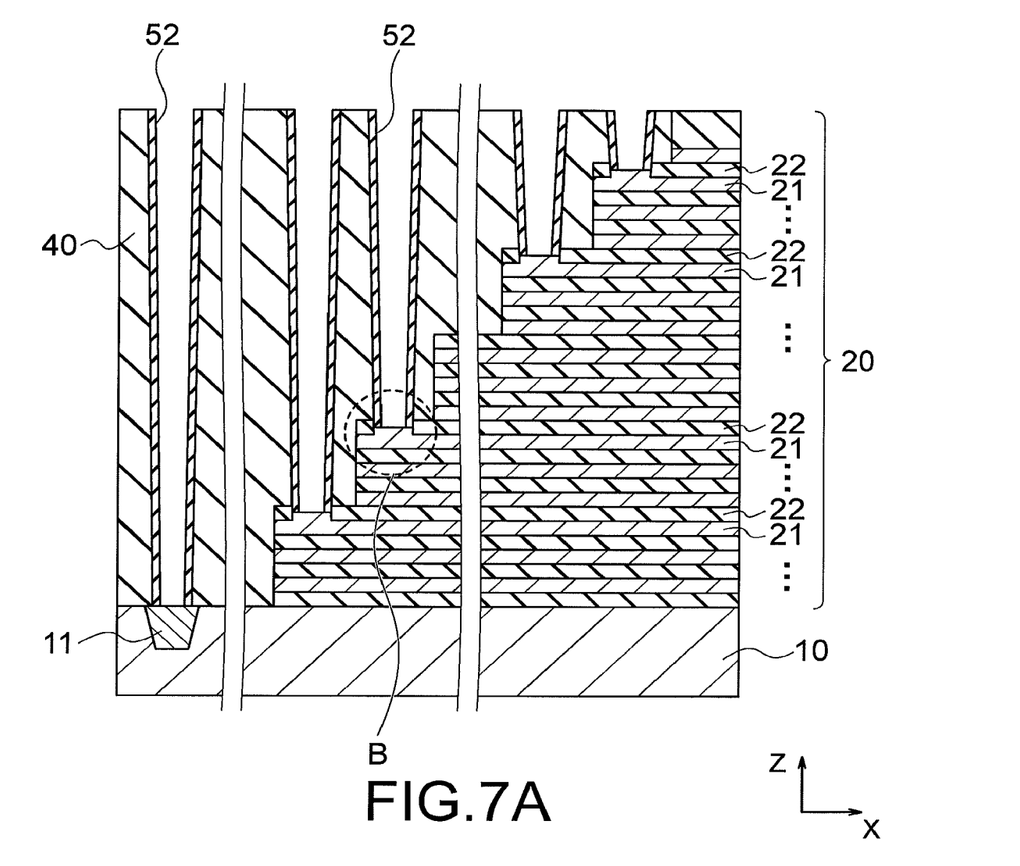
FIG. 7A is a sectional view for explaining a process of etching a part of an insulating film.
Figure 7B:
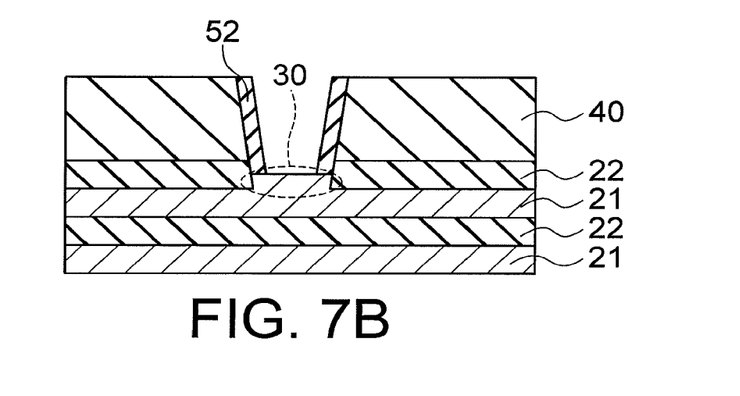
FIG. 7B is an enlarged view of a region B illustrated in FIG. 7A.

Next, the insulating film 52 provided on the bottom surfaces of the contact holes 53 and on the top surface of the interlayer dielectric film 40 is removed by RIE (Reactive Ion Etching) as illustrated in FIGS. 7A and 7B. FIG. 7B is an enlarged view of a region B illustrated in FIG. 7A.

At the time of removing the insulating film 52 in the manner as described above, there is a possibility that the metal films 21 are pieced through if the metal films 21 are thin. However, because the conducting films 30 are provided on the metal films 21, respectively, in the present embodiment, the conducting films 30 function as etching stopper films. Accordingly, the metal films 21 can be avoided from being pierced through.

Figure 8:
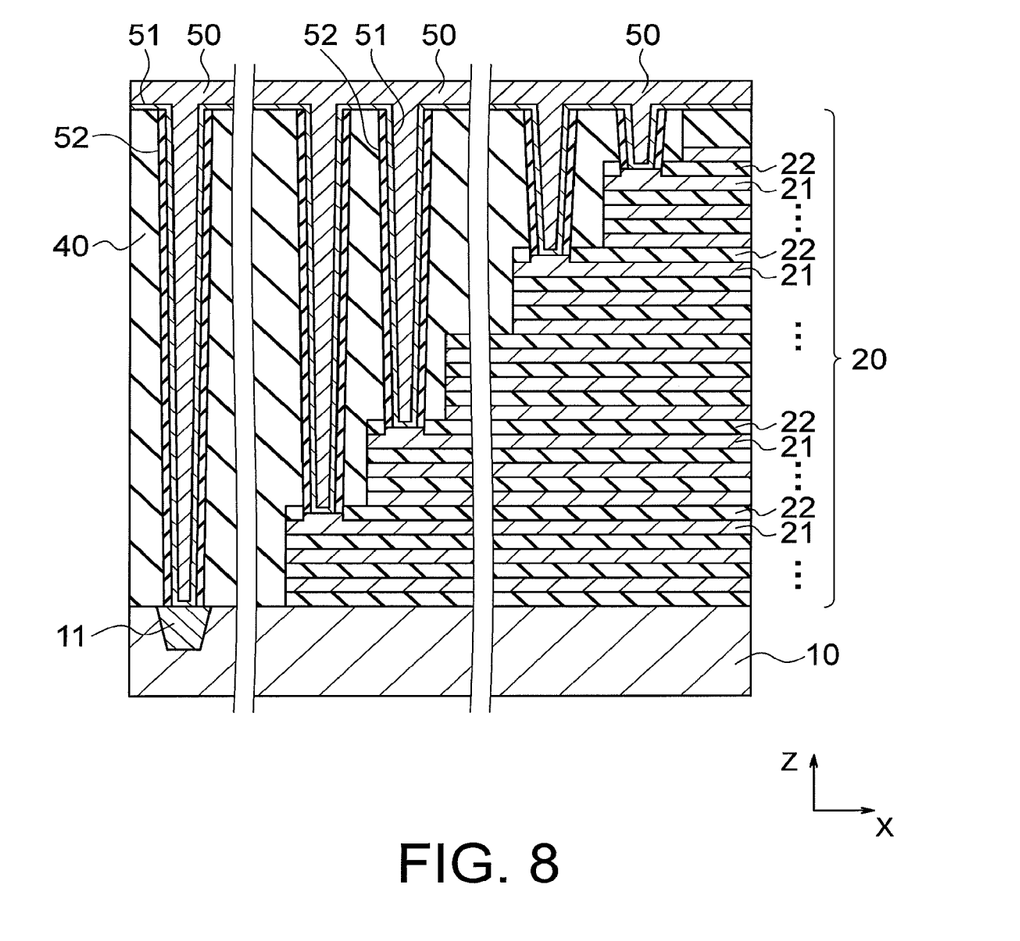
FIG. 8 is a sectional view for explaining a process of forming a barrier metal film and contact portions.

Next, as illustrated in FIG. 8, the barrier metal film 51 and the contact portions 50 are sequentially formed. The barrier metal film 51 and the contact portions 50 can be formed by a CVD method. At this time, the barrier metal film 51 is formed in the contact holes 53 to cover the entire top surfaces of the conducting films 30 along with the insulating film 52. The contact portions 50 are formed in the contact holes 53 to be electrically connected to the conducting films 30 via the barrier metal film 51, respectively. When metal included in the metal films 21 and the conducting films 30 is tungsten, the contact portions 50 can be formed using tungsten hexafluoride gas and reducing gas including silane ($SiH_4$) or diborane ($B_2H_6$). In this case, the contact portions 50 having high coverage can be formed.

Finally, the barrier metal film 51 and the contact portions 50 are polished by CMP (Chemical Mechanical Polishing). As a result, the semiconductor device 1 illustrated in FIG. 1 is completed.

In the present embodiment described above, the conducting films 30 respectively protrude from the metal films 21. Accordingly, the etching stopper performance is increased during etching of the insulating film 52 provided on the bottom surfaces of the contact holes 53. Accordingly, damages of the metal films 21 can be avoided during formation of the contact portions 50.

Further, in the present embodiment, if the lengths in the X direction of the respective steps at the end portions of the metal films 21, that is, the terrace lengths are short, the distances in the X direction between the contact portions 50 and the metal films 21 (word lines) are narrowed and it becomes difficult to ensure the dielectric breakdown voltage. However, because the insulating film 52 surrounds the contact portions 50 in the present embodiment, a sufficient dielectric breakdown voltage can be ensured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor substrate;
a stack body including metal films and first insulating films alternately stacked on the semiconductor substrate and including a stepped end portion;
conducting films respectively protruding from the metal films on all steps of the end portion;
contact portions respectively provided above the conducting films;
a second insulting film surrounding side surfaces of the contact portions; and
a barrier metal film provided between the second insulating film and the contact portions and between the conducting films and the contact portions, wherein
entire top surfaces of the conducting films are covered by the barrier metal film and the second insulating film, and
each of the conducting films have a thickness equal to or smaller than a half of a thickness of the first insulating films, and
in the end portion, an upper layer of each of all steps is the first insulating film, and
depths of the contact portions are different one another, and
the conducting film is provided below a bottom surface of each contact portion.

2. The semiconductor device according to claim 1, wherein a material of the conducting films and a material of the contact portions are same as material included in the metal films.

3. The semiconductor device according to claim 2, wherein the metal includes at least one of tungsten (W), cobalt (Co), nickel (Ni), and molybdenum (Mo).

4. A manufacturing method of a semiconductor device, the method comprising:
forming contact holes respectively reaching metal films on corresponding steps on a stepped end portion of a stack body in which metal films and first insulating films are alternately stacked on a semiconductor substrate;
forming conducting films on the metal films exposed from the contact holes, respectively;
forming a second insulting film on inner surfaces of the contact holes and top surfaces of the conducting films;
forming a barrier metal film in the contact holes, the barrier metal film covering the second insulating film and covering the entire top surfaces of the conducting films along with the second insulating film; and
forming contact portions in the contact holes, respectively, the contact portions being electrically connected to the conducting films via the barrier metal film wherein
each of the conducting films have a thickness equal to or smaller than a half of a thickness of the first insulating films, and
in the end portion, an upper layer of each of all steps is the first insulating film, and
depths of the contact portions are different one another, and
the conducting film is provided below a bottom surface of each contact portion.

5. The manufacturing method of the semiconductor device according to claim 4, comprising forming the conducting films and the contact portions by metal included in the metal films.

6. The manufacturing method of the semiconductor device according to claim 5, wherein the metal includes at least one of tungsten (W), cobalt (Co), nickel (Ni), and molybdenum (Mo).

* * * * *